(12) United States Patent
Parthasarathy et al.

(10) Patent No.: US 11,489,543 B1
(45) Date of Patent: Nov. 1, 2022

(54) LOSSLESS DATA COMPRESSION FOR SENSORS

(71) Applicant: University of South Florida, Tampa, FL (US)

(72) Inventors: Ashwin Bharadwaj Parthasarathy, Tampa, FL (US); Arindam Biswas, Tampa, FL (US); Dillon Buffone, Tampa, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 330 days.

(21) Appl. No.: 16/825,112

(22) Filed: Mar. 20, 2020

Related U.S. Application Data

(60) Provisional application No. 62/822,157, filed on Mar. 22, 2019.

(51) Int. Cl.
*H03M 7/00* (2006.01)
*H03M 7/30* (2006.01)

(52) U.S. Cl.
CPC ....... *H03M 7/3062* (2013.01); *H03M 7/3066* (2013.01); *H03M 7/60* (2013.01)

(58) Field of Classification Search
CPC ..... H03M 7/3062; H03M 7/3066; H03M 7/60
USPC .................................... 341/50, 51; 708/203
See application file for complete search history.

(56) References Cited

U.S. PATENT DOCUMENTS

| 4,569,028 | A | * | 2/1986 | Dolazza | H04N 7/24 341/126 |
| 5,138,552 | A | * | 8/1992 | Weedon | H03M 1/123 341/157 |
| 6,076,010 | A | | 6/2000 | Boas et al. | |
| 8,082,015 | B2 | | 12/2011 | Yodh et al. | |
| 8,989,596 | B2 | * | 3/2015 | Saunders | H04B 10/07953 398/163 |
| 2008/0042888 | A1 | * | 2/2008 | Danesh | H04N 5/217 341/157 |
| 2008/0048901 | A1 | * | 2/2008 | Cormier | H04N 5/3742 348/E5.079 |

OTHER PUBLICATIONS

Wang et al. "Fast blood flow monitoring in deep tissues with real-time software correlators", Mar. 1, 2016 Vol. 7, No. 3 Biomedical Optics Express.
Magatti et al. "25 ns software correlator for photon and fluorescence correlation spectroscopy", Review of Scientific Instruments 74, 1135 (2003).
Magatti et al. "Fast multi-tau real-time software correlator for dynamic light scattering", Aug. 20, 2001, vol. 40, No. 24 Applied Optics.

(Continued)

*Primary Examiner* — Jean B Jeanglaude
(74) *Attorney, Agent, or Firm* — Quarles & Brady LLP

(57) ABSTRACT

Systems or methods for losslessly compressing data received from sensors, such as photon counters, are disclosed. An integer representation of a sensor reading is received from a sensor. The integer representation is combined with additional integer representations from each of a plurality of additional sensors into a single integer value. The single integer value is then stored as an element of an integer array that represents a predefined sample interval.

20 Claims, 3 Drawing Sheets

(56) References Cited

OTHER PUBLICATIONS

Carp et al. "Combined multi-distance frequency domain and diffuse correlation spectroscopy system with simultaneous data acquisition and realtime analysis", vol. 8, No. 9, Sep. 1, 2017 Biomedical Optics Express.
Tivnan et al. "High Frequency Sampling of TTL Pulses on a Raspberry Pi for Diffuse Correlation Spectroscopy Applications", Sensors 2015, 15, 19709-19722.
Carp, S. A., et al. Combined multi-distance frequency domain and diffuse correlation spectroscopy system with simultaneous data acquisition and real-time analysis. Biomed Opt Express 8, 3993-4006, doi:10.1364/BOE.8.003993 (2017).
Tamborini, D. et al. Development and characterization of a multidistance and multiwavelength diffuse correlation spectroscopy system. Neurophotonics 5, 011015, doi:10.1117/1.NPh.5.1.011015 (2017).

\* cited by examiner

US 11,489,543 B1

LOSSLESS DATA COMPRESSION FOR SENSORS

BACKGROUND

This application claims priority to, and the benefit of, U.S. Provisional Patent Application No. 62/822,157, filed on Mar. 22, 2019 and entitled "LOSSLESS DATA COMPRESSION FOR SENSORS," which is incorporated by reference as if set forth herein in its entirety.

BACKGROUND

Sensors often generate readings frequently. For example, photon counters may determine thousands or millions of times per second whether or not a photon detector has detected a photon and the number of times the photon detector has detected the photon. The readings can often consume large amounts of data when stored in memory.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Disclosed are various approaches for losslessly compressing data received from sensors, such as photon detectors or photon counters. In the following discussion, a general description of the system and its components is provided, followed by a discussion of the operation of the same.

Figure 1:
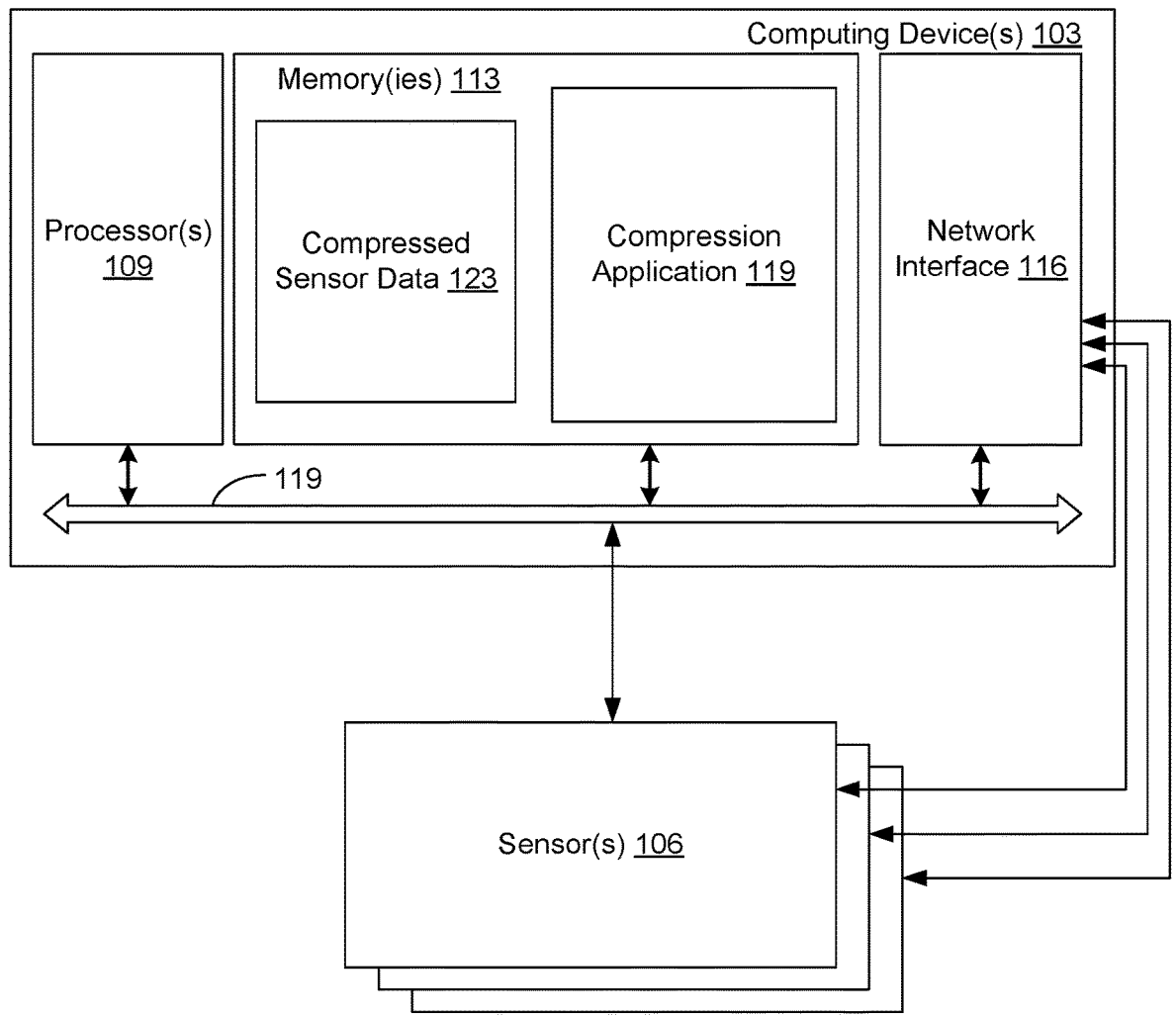
FIG. 1 is a drawing of an implementation of an embodiment of the present disclosure.

With reference to FIG. 1, shown is a computing device 103 in data communication with one or more sensors 106. Each computing device 103 includes a processor 109, a memory 113, and a network interface 116, each of which is electrically and communicatively coupled to a local interface 119. To this end, each computing device 103 may represent a server computer, a client computing device (e.g., personal computer, mobile device, smartphone, tablet, wearable computing device, etc.), a single-board computer (e.g., a microcontroller, system-on-a-chip (SoC), or similar device). The local interface 119 may include, for example, a data bus with an accompanying address/control bus or other bus structure as can be appreciated.

Stored in the memory 113 are both data and several components that are executable by the processor 109. In particular, stored in the memory 113 and executable by the processor 109 are list of main applications, and potentially other applications. Also stored in the memory 113 may be a data store ### and other data. In addition, an operating system may be stored in the memory 113 and executable by the processor 109.

It is understood that there may be other applications that are stored in the memory 113 and are executable by the processor 109 as can be appreciated. Where any component discussed herein is implemented in the form of software, any one of a number of programming languages may be employed such as, for example, C, C++, C#, Objective C, Java®, JavaScript®, Perl, PHP, Visual Basic®, Python®, Ruby, Flash®, or other programming languages.

A number of software components are stored in the memory 113 and are executable by the processor 109. In this respect, the term "executable" means a program file that is in a form that can ultimately be run by the processor 109. Examples of executable programs may be, for example, a compiled program that can be translated into machine code in a format that can be loaded into a random access portion of the memory 113 and run by the processor 109, source code that may be expressed in proper format such as object code that is capable of being loaded into a random access portion of the memory 113 and executed by the processor 109, or source code that may be interpreted by another executable program to generate instructions in a random access portion of the memory 113 to be executed by the processor 109, etc. An executable program may be stored in any portion or component of the memory 113 including, for example, random access memory (RAM), read-only memory (ROM), hard drive, solid-state drive, Universal Serial Bus (USB) flash drive, memory card, optical disc such as compact disc (CD) or digital versatile disc (DVD), floppy disk, magnetic tape, or other memory components.

The processor 109 may represent multiple processors 109 or multiple processor cores and the memory 113 may represent multiple memories 113 that operate in parallel processing circuits, respectively. In such a case, the local interface 119 may be an appropriate network that facilitates communication between any two of the multiple processors 109, between any processor 109 and any of the memories 113, or between any two of the memories 113. The local interface 119 may include additional systems designed to coordinate this communication, including, for example, performing load balancing. The processor 109 may be of electrical or of some other available construction.

The memory 113 is defined herein as including both volatile and nonvolatile memory and data storage components. Volatile components are those that do not retain data values upon loss of power. Nonvolatile components are those that retain data upon a loss of power. Thus, the memory 113 may include, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, or other memory components, or a combination of any two or more of these memory components. In addition, the RAM may include, for example, static random access memory (SRAM), dynamic random access memory (DRAM), or magnetic random access memory (MRAM) and other such devices. The ROM may include, for example, a programmable read-only memory (PROM), an erasable programmable read-only memory (EPROM), an electrically erasable programmable read-only memory (EEPROM), or other like memory device.

The network interface 116 can represent any hardware component that connects a computer to a computer network. Examples of network interfaces 116 include Ethernet interfaces, Wi-Fi interfaces, BLUETOOTH® interfaces, and similar interfaces. In some instances, network interfaces 116 may also allow for the computing device 103 to directly connect to another computing device or device.

The compression application 119 represents an application that receives sensor data from one or more sensors 106 at predefined time intervals. The predefined time intervals may represent sample intervals of the sensors 106. The sensor data can then be converted into compressed sensor data 123 as further described herein. Moreover, the compressed sensor data 123 may be read, extracted, or decompressed by the compression application 119 when the sensor data needs to be accessed or read by another application or computing device.

The compressed sensor data 123 represents a compressed version of the sensor data generated by respective sensors 106. For example, the compressed sensor data 123 may represent an integer array, with individual elements representing a 16-bit, 32-bit, or 64-bit integer as desired by various embodiments of the present disclosure. Each integer element may represent an individual interval of time in which one or more sensors 106 were reporting data. For example, if a sensor 106 were sampling data every microsecond, then the compressed sensor data 123 may include one-million elements in order to store readings collected for a single second. As discussed further herein, each sensor 106 reporting data at a particular time interval may have its sensor reading stored in the same element of the integer array representing the compressed sensor data 123.

The sensor 106 represents any device which can measure or detect an event occurring in its environment, detect or measure a current state or change state of its environment, or perform a similar detection. Examples of sensors 106 include acoustic sensors (microphones, seismometers, etc.), chemical sensors, electromagnetic sensors (e.g., hall effect sensors, magnetometer, voltmeter, etc), optical sensors (photon detectors/counters, CMOS sensors, infrared sensors, photoresistors, etc.), pressure sensors, thermal sensors, etc. A sensor 106 may periodically sample its environment at predefined periods of time and, if configured appropriately, report the value of the sample to the computing device 103. The value may be reported as a digital number or as an analog reading or value. For example, every second, a thermometer could report the current temperature. As another example, every microsecond, a photon counter could report how many photons have been detected by a photon detector during the previous microsecond.

Accordingly, a sensor 106 may be configured to be in data communication with the computing device 103. In some embodiments, a sensor 106 may in data communication with the computing device 103 through the network interface 116 of the computing device 103. This may occur, for example, if the sensors and the computing device 103 are connected to the same local area network (LAN), personal area network (PAN), or are configured to communicate with each other over the Internet. In other embodiments, the sensors 106 may be directly connected to the computing device 103 and electrically coupled to the local interface 119 (e.g., through a universal serial bus (USB) or similar connection).

Next, a general description of the operation of the various components depicted in FIG. 1 is provided. More detailed illustrations are provided in the discussion of the following figures. Although the example of a photon detector and photon counter is described to illustrate the principles of the present disclosure, the principles of the present disclosure described herein are applicable to other types of sensors 106.

Sensors 106 such as photon counters are often used in conjunction with photon detectors to detect and count the number of photons that impinge on the sensor 106. Given a small sample interval (e.g., on the nanosecond or microsecond scale), it is common for the photon counter/detector to record zero or only a single photon impacting the sensor 106 during the sample interval. Occasionally, two photons may be recorded as impacting the sensor 106 and very rarely three photons may be recorded as impacting the sensor 106. Accordingly, a single bit or even two bits may be used to represent the total number of photons that are detected during the sample interval. However, due to the architectures of modern computer processors, the photon detector often will record and/or report the number of photons using a sixteen or thirty-two bit value, which wastes considerable amounts of space in memory 113, especially when a large number of photon detectors and counters are reporting data at frequent intervals or when photons are being detected for a long period of time.

Accordingly, the compression application 119 can be executed to receive, process, and store sensor data received from sensors 106 (e.g., photon counters). For example, the compression application 119 may receive every microsecond (or other predefined interval of time) from a plurality of photon counters the number of photons detected by respective ones of a plurality of photon detectors during the preceding microsecond or other sample interval. The compression application 119 can then use bitwise operations or other bit-packing techniques to combine the individual values from each of the plurality of photon counters into a single integer value that can be stored in a respective element of the integer array representing the compressed sensor data 123.

Figure 2:
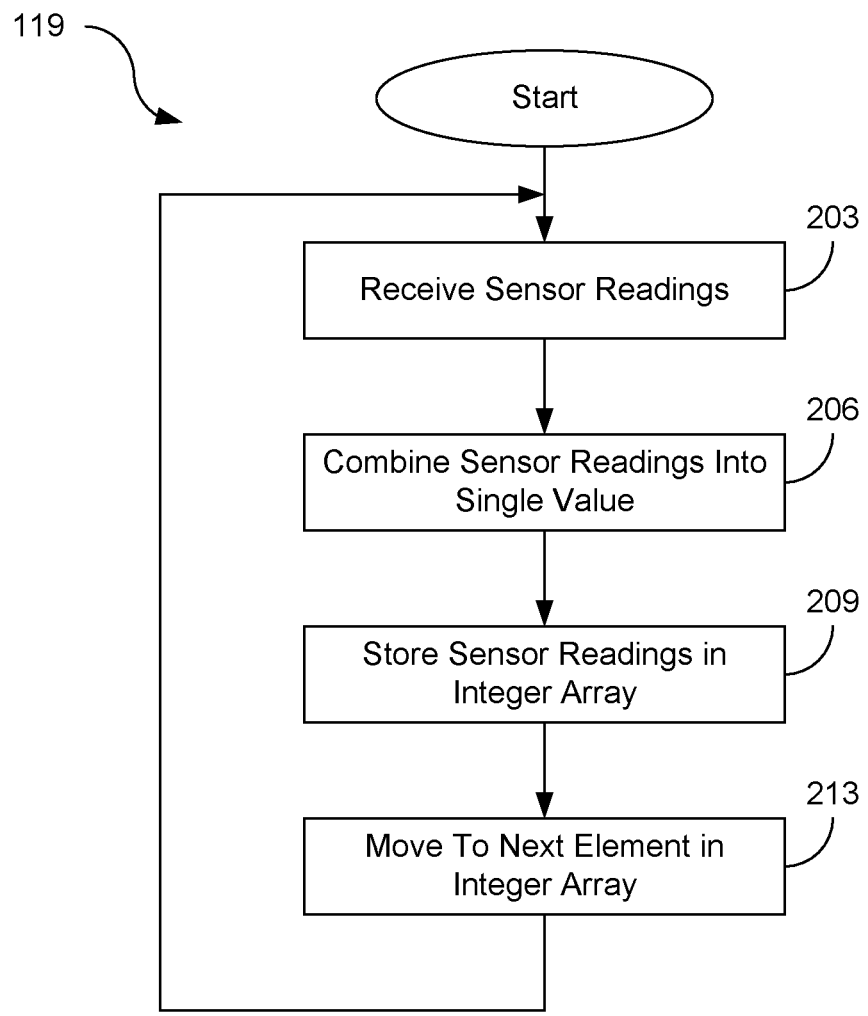
FIG. 2 is a flowchart illustrating one example of functionality implemented as portions of an application executed in the implementation of FIG. 1 according to various embodiments of the present disclosure.

Referring next to FIG. 2, shown is a flowchart that provides one example of the operation of a portion of the compression application 119 according to various embodiments. It is understood that the flowchart of FIG. 2 provides merely an example of the many different types of functional arrangements that may be employed to implement various embodiments of the present disclosure. As an alternative, the flowchart of FIG. 2 may be viewed as depicting an example of elements of a method implemented according to one or more embodiments.

Beginning with box 203, the compression application 119 receives sensor readings from one or more sensors 106. For example, the compression application 119 could receive a number of photons detected from a photon counter for a respective photon detector. Likewise, if a plurality of photon counters were to report a respective number of photons detected by a respective photon detector, then the compression application 119 would receive each respective number of photons.

Then at box 206, the compression application 119 can combine the sensor readings 106 into a single integer value using various bit-shift operations or bit-packing techniques. For example, if the integer array representing the compressed sensor data 123 were composed of 32-bit integers, and the compression application 119 received readings from sixteen separate sensors 106 (e.g., sixteen photon counters), with each of the sensors 106 only requiring two bits to represent a sensor reading (e.g., two bits of data to represent the number of photons counted), then the compression application 119 could create a 32-bit integer with the two lowest-order bits representing data received from the first sensor 106, the next two lowest-order bits representing data received from the second sensor 106, etc. However, sensor data can also be sequentially written to the highest-order bits in some implementations. Bit-shift or bit-wise operations could be used to write data to the 32-bit integer one bit at a time.

The number of sensor readings that can be combined into a single integer value can vary based on several factors. For example, the size of the individual integer elements in the integer array representing the compress sensor data 123 will place an upper limit on the number of sensor readings that can be combined. For instance, a 64-bit integer representation will allow for more sensor readings to be stored in a single array element than a 32-bit or 16-bit integer representation would allow. In addition, the desired resolution will impact the number of sensor readings that can be combined into a single integer value. As an example, if the expected number of photons reported by a photon counter during the sample interval were less than four, then two bits could be used for each sensor 106, allowing for sixteen sensors 106 to be represented by a single 32-bit integer. However, if the sensor's resolution required eight bits to represent a single sensor reading, then only four sensors 106 could be represented by a single 32-bit integer. These factors are generally known in advance and the compression application 119 is generally configured to accommodate these predefined or predetermined values prior to operation.

Which bits in the integer value to be stored in the integer array representing the compressed sensor data 123 are used to represent individual sensors 106 can also be configured prior to run time. For example, individual sensors 106 can be assigned an identifier (e.g., "Sensor 1," "Sensor 2," etc.), and the mapping of the sensor 106 to the sensor identifier can be stored in a mapping table stored in the memory 113 of the computing device. The compression application 119 could then write data received from whichever sensor 106 is identified as "Sensor 1" to the lowest-order bits, the data received from whichever sensor 106 is identified as "Sensor 2" to the next lowest-order bits, etc. However, other arrangements can be used as desired (e.g., sequentially writing sensor data to the highest-order bits).

Proceeding next to box 209, the compression application 119 stores the integer value representing the combination of the sensor readings received from the sensors 106 (e.g., the combination of the number of photons counted from each of the photon counters) in a respective element of the integer array representing the compressed sensor data 123. For example, the compression application 119 may store the integer value in the current index of the integer array representing the compressed sensor data 123.

Next at box 213, the compression application 119 increments the index counter for the integer array representing the compressed sensor data 123. This allows for the compression application 119 to write the next set of sensor readings (e.g., photon counts) to the next element in the integer array. Execution of the compression application 119 then loops back to the beginning to process the next set of sensor readings received. The loop may continue until the compression application 119 receives a stop signal.

Figure 3:
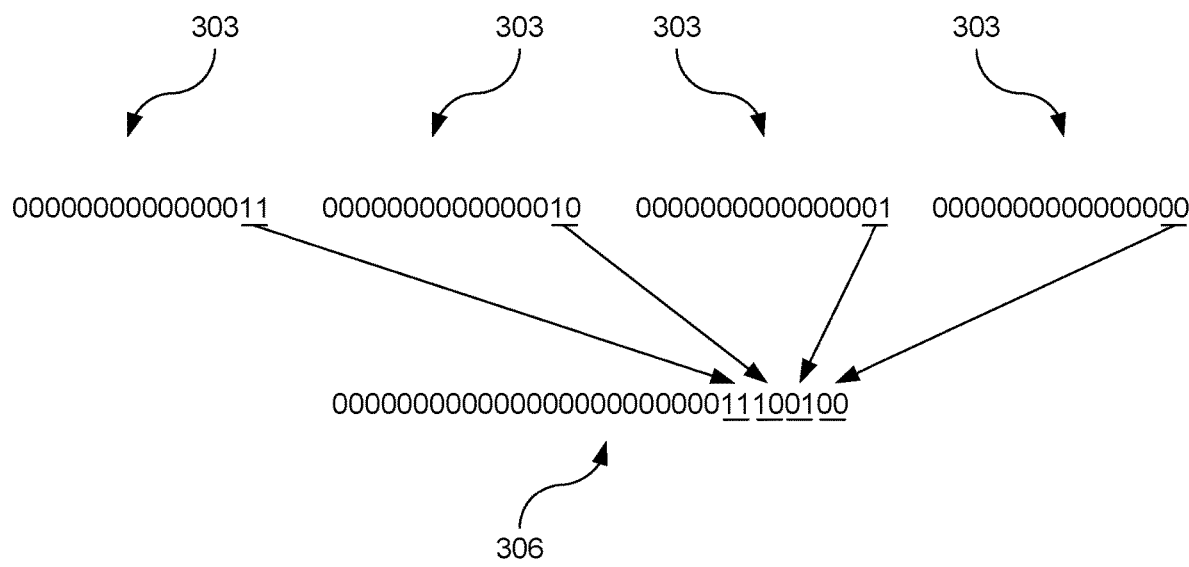
FIG. 3 is a diagram illustrating the compression operation according to various embodiments of the present disclosure.

FIG. 3 provides a pictorial diagram illustrating the operation of the compression application 119 according to the flowchart of FIG. 2. As shown, a number of binary representations 303 of sensor readings are depicted. Each binary representation 303 is sixteen bits long. However, other data structures may also be used (e.g., 64-bit, 32-bit, or 8-bit representations of integers). Generally, the size of the binary representation 303 is defined by the hardware used by the individual sensors 106.

As illustrated, while each binary representation 303 is a single 16-bit integer, only the two least-significant bits are used to represent data. For example, a photon counter reporting the number of photons detected each microsecond might only report 0, 1, 2, or (in rare cases) 3 photons detected per microsecond. The fourteen most-significant bits are not used to store data. Accordingly, the two least-significant bits from each binary representation 303 can be combined into a single compressed representation 306 of the sensor readings, depicted as a single 32-bit integer. However, other integer sizes (e.g., 8-bit, 16-bit or 64-bit integers) may also be used as a compressed representation 306 of the sensor readings according to various embodiments of the present disclosure.

Although the compression application 119, and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits (ASICs) having appropriate logic gates, field-programmable gate arrays (FPGAs), or other components, etc. Such technologies are generally well known by those skilled in the art and, consequently, are not described in detail herein.

The flowchart of FIG. 2 shows the functionality and operation of an implementation of portions of the compression application 119. If embodied in software, each block may represent a module, segment, or portion of code that includes program instructions to implement the specified logical function(s). The program instructions may be embodied in the form of source code that includes human-readable statements written in a programming language or machine code that includes numerical instructions recognizable by a suitable execution system such as a processor 109 in a computer system or other system. The machine code may be converted from the source code through various processes. For example, the machine code may be generated from the source code with a compiler prior to execution of the corresponding application. As another example, the machine code may be generated from the source code concurrently with execution with an interpreter. Other approaches can also be used. If embodied in hardware, each block may represent a circuit or a number of interconnected circuits to implement the specified logical function or functions.

Although the flowchart of FIG. 2 shows a specific order of execution, it is understood that the order of execution may differ from that which is depicted. For example, the order of execution of two or more blocks may be scrambled relative to the order shown. Also, two or more blocks shown in succession in FIG. 2 may be executed concurrently or with partial concurrence. Further, in some embodiments, one or more of the blocks shown in FIG. 2 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the compression application 119, that includes software or code can be embodied in any non-transitory computer-readable medium for use by or in connection with an instruction execution system such as, for example, a processor 109 in a computer system or other system. In this sense, the logic may include, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can include any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Further, any logic or application described herein, including the compression application 119, may be implemented and structured in a variety of ways. For example, one or more applications described may be implemented as modules or components of a single application. Further, one or more applications described herein may be executed in shared or separate computing devices or a combination thereof. For example, a plurality of the applications described herein may execute in the same computing device 103, or in multiple computing devices in the same computing environment or computing cluster.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiments without departing substantially from the spirit and principles of the disclosure. All such modifications and variations are intended to be included herein within the scope of this disclosure and protected by the following claims.

Therefore, the following is claimed:

1. A system, comprising:
a plurality of photon detectors;
a plurality of photon counters, each of the plurality of photon counters electrically coupled to a respective one of the plurality of photon detectors and configured to generate a respective number of photons detected by the respective one of the plurality of photon detectors during a predefined sample interval;
a computing device in data communication with the plurality of photon counters, the computing comprising a processor and a memory;
an integer array stored in the memory, each element in the integer array representing a consecutive instance of the predefined sample interval; and
machine readable instructions stored in the memory that, when executed by the processor, cause the computing device to at least:
receive from each of the plurality of photon counters the respective number of photons detected by the respective one of the plurality of photon detectors; and
combine the respective number of photons received from each of the plurality of photon counters into an element in the integer array corresponding to the predefined sample interval.

2. The system of claim 1, wherein the machine readable instructions that cause the computing device to combine the respective number of photons received from each of the plurality of photon counters into the element in the integer array further cause the computing device to:
write a first one of the respective number of photons received from each of the plurality of photon counters to the element in the integer array; and
for each additional one of the respective number of photons received from each of the plurality of photon counters, perform a bitshift operation to write the additional respective number of photons to the element in the integer array without overwriting the first one of the respective number of photons written to the element in the integer array.

3. The system of claim 2, wherein the first one of the respective number of photons received from each of the plurality of photon counters is written to the element in the integer array, the element being one or more lowest-order bits in the integer array.

4. The system of claim 2, wherein the first one of the respective number of photons received from each of the plurality of photon counters is written to the element in the integer array, the element being one or more highest-order bits in the integer array.

5. The system of claim 2, wherein the predefined sample interval comprises a sample interval of each photon detector of the plurality of photon detectors.

6. A method, comprising:
receiving an integer representation of a respective sensor reading from each of a plurality of sensors, the respective sensor reading having been obtained at a predefined sample interval;
combining the integer representation of the respective sensor reading received from each of the plurality of sensors into a single integer value; and
storing the single integer value into an element of an integer array that represents the predefined sample interval of the plurality of sensors, the integer array comprising a plurality of elements, each element in the integer array representing a consecutive instance of the predefined sample interval.

7. The method of claim 6, wherein the plurality of sensors comprise a plurality of photon detectors.

8. The method of claim 6, wherein combining the integer representation comprises performing bitwise operations to combine the integer representation of the respective sensor reading received from each of the plurality of sensors into the single integer value.

9. The method of claim 8, wherein the bitwise operations comprise bitshift operations to shift one or more predefined bits to combine the integer representation of the respective sensor reading.

10. The method of claim 9, wherein the combining the integer representation comprises:
identifying a first integer representation from a first sensor of the plurality of sensors, the first integer representation corresponding to a predefined number of bits;
shifting the predefined number of bits of a second integer representation from a second sensor of the plurality of sensors; and
combining the first integer representation and the shifted second integer representation into the single integer value.

11. The method of claim 10, wherein the integer representation of the respective sensor is received in on one or more least-significant bits,
wherein the predefined number of bits of the second integer representation is shifted leftward.

12. The method of claim 10, wherein the first integer representation and the shifted second integer representation are combined using a bitwise operation.

13. The method of claim 6, wherein the predefined sample interval comprises a sample interval of each sensor of the plurality of sensors.

14. The method of claim 6, wherein the integer representation of the respective sensor comprises a number of photons detected by the respective sensor.

15. The method of claim 6, wherein the integer representation of the respective sensor is indicative of a number of photons detected by the respective sensor.

16. A system, comprising:
a plurality of sensors, each of the plurality of sensors configured to at least:
obtain a sensor reading at a predefined sample interval;
generate an integer representation of the sensor reading;
send the integer representation of the sensor reading to a computing device;
the computing device being in data communication with the plurality of sensors and comprising a processor and a memory;
an integer array stored in the memory, each element in the integer array representing a consecutive instance of the predefined sample interval; and
machine readable instructions stored in the memory that, when executed by the processor, cause the computing device to at least:
receive the integer representation of the sensor reading from each of the plurality of sensors;
combine the integer representation of the sensor reading received from each of the plurality of sensors into a single integer value; and
store the single integer value into an element of the integer array that represents the predefined sample interval.

17. The system of claim 16, wherein the machine readable instructions that cause the computing device to at least combine the integer representation of the sensor reading received from each of the plurality of sensors into a single integer value further cause the computing device to at least perform bitwise operations to combine the integer representation of the sensor reading received from each of the plurality of sensors into the single integer value.

18. The system of claim 16, wherein the sensor is a photon detector.

19. The system of claim 16, wherein the integer representation of the respective sensor is indicative of a number of photons detected by the respective sensor.

20. The system of claim 16, wherein the predefined sample interval comprises a sample interval of each sensor of the plurality of sensors.

* * * * *